(12) United States Patent
Leu et al.

(10) Patent No.: US 7,207,706 B2
(45) Date of Patent: *Apr. 24, 2007

(54) LIGHT EMITTING DIODE HAVING DIFFRACTION GRATING AND PLANAR LIGHT SOURCE DEVICE USING THE SAME

(75) Inventors: Charles Leu, Fremont, CA (US); Wen-Jeng Huang, Tu-chen (TW); Jyh-Chain Lin, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 110 days.

This patent is subject to a terminal disclaimer.

(21) Appl. No.: 10/946,447

(22) Filed: Sep. 20, 2004

(65) Prior Publication Data

US 2005/0063173 A1 Mar. 24, 2005

(30) Foreign Application Priority Data

Sep. 19, 2003 (TW) .............................. 92125989 A

(51) Int. Cl.
- F21V 7/04 (2006.01)
- F21V 29/00 (2006.01)
- H01L 33/00 (2006.01)
- H01L 21/00 (2006.01)
- H01J 1/62 (2006.01)

(52) U.S. Cl. ................. 362/612; 362/800; 362/267; 257/98; 257/99; 438/32; 313/512

(58) Field of Classification Search ................ 362/608, 362/326, 612–614, 267; 257/98, 99; 438/32
See application file for complete search history.

(56) References Cited

U.S. PATENT DOCUMENTS

| | | | | |
|---|---|---|---|---|
| 5,093,768 | A * | 3/1992 | Ohe | 362/241 |
| 5,371,434 | A * | 12/1994 | Rawlings | 313/506 |
| 6,034,819 | A * | 3/2000 | Ogata | 359/565 |
| 6,065,845 | A | 5/2000 | Miyazaki | |
| 6,196,691 | B1 | 3/2001 | Ochiai | |
| 6,379,017 | B2 * | 4/2002 | Nakabayashi et al. | 362/619 |
| 6,680,491 | B2 * | 1/2004 | Nakanishi et al. | 257/98 |
| 6,976,779 | B2 * | 12/2005 | Ohtsuki et al. | 362/608 |
| 7,059,728 | B2 * | 6/2006 | Alasaarela et al. | 353/94 |
| 2003/0089914 | A1 * | 5/2003 | Chen | 257/79 |
| 2004/0109629 | A1 * | 6/2004 | Kondo | 385/14 |
| 2004/0256628 | A1 * | 12/2004 | Chin et al. | 257/98 |
| 2005/0036319 | A1 * | 2/2005 | Gruhlke et al. | 362/311 |
| 2006/0102914 | A1 * | 5/2006 | Smits et al. | 257/98 |

* cited by examiner

Primary Examiner—John Anthony Ward
Assistant Examiner—David Makiya
(74) Attorney, Agent, or Firm—Wei Te Chung

(57) ABSTRACT

A planar light source device (100) for a display device includes a light guide plate (120) and pluralities of light emitting diodes (110). The light guide plate has a light incident surface (121). The light emitting diodes are located in the vicinity of the light incident surface. Each light emitting diode has a light emission surface opposite to the light incident surface of the light guide plate, and has a diffraction grating (117) provided on the light emission surface for improving a range of divergence of light beams emitted therefrom.

15 Claims, 3 Drawing Sheets

LIGHT EMITTING DIODE HAVING DIFFRACTION GRATING AND PLANAR LIGHT SOURCE DEVICE USING THE SAME

BACKGROUND OF THE INVENTION

1. Field of the Invention

The present invention relates to a planar light source device for use in a liquid crystal display (LCD), and particularly to a light emitting diode used in a planar light source device having a diffraction grating.

2. Prior Art

A typical LCD device comprises a liquid crystal display panel, and a surface lighting device mounted under the liquid crystal display panel for supplying light beams thereto. The surface lighting device mainly comprises one or more light sources for emitting light beams, and a light guide plate. The light guide plate receives the emitted light beams via a light incident surface thereof, and emits the light beams via a light output surface thereof in order to uniformly illuminate the liquid crystal display panel.

Conventionally, there are two types of light sources used in a surface lighting device of an LCD: a linear source such as a cold cathode fluorescent lamp (CCFL), and a point light source such as a light emitting diode (LED). In general, it is more difficult to obtain uniform illumination when using a series of point light sources compared with using a linear source, due to the divergent angles of light emitted from the point light sources. For example, LEDs used as light sources emit light beams having a divergent angle in the range from 30° to 130°. FIG. 5 shows a light beam distribution of a planar light source device using LEDs as the light sources. The planar light source device comprises a light guide plate 13, and a plurality of LEDs 12 arranged at one side of the light guide plate 13 for providing light beams. In operation, light beams emitted by the LEDs 12 enter the light guide plate 13 through a light incident surface (not labeled) thereof, and then transmit out from a light output surface (not labeled) thereof. Thus, the light guide plate 13 generally exhibits a plurality of dark areas 15 corresponding to spaces between adjacent LEDs 12. It is difficult to obtain uniform illumination for the planar light source device.

It is desired to provide a planar light source device for use in a liquid crystal display device which overcomes the above-described problems.

SUMMARY OF THE INVENTION

An object of the present invention is to provide an LED which emits light beams having a large range of divergent angles.

Another object of the present invention is to provide a planar light source device with diminished or no dark areas for improving uniform light distribution.

To achieve the above objects, the present invention provides a light emitting diode comprising a mounting substrate, a light emitting component, a coating resin, and a diffraction grating. The light emitting component is installed on the mounting substrate. The coating resin covers and protects the light emitting component, and having a light emission surface. The diffraction grating is formed on the light emission surface. The light emitting component emits light beams, and the light beams are diffracted by the diffraction grating. The diffraction grating diffracts each light beam passing therethrough into a plurality of light beams propagating in different directions.

The present invention also provides a planar light source device for a display device comprising a light guide plate having a light incident surface, and at least a light emitting diodes located in the vicinity of the light incident surface. Each light emitting diode has a light emission surface opposite to the light incident surface of the light guide plate, and has a diffraction grating positioned on the light emission surface for improving a range of divergence of light beams emitted therefrom.

Other objects, advantages, and novel features of the present invention will become more apparent from the following detailed description when taken in conjunction with the accompanying drawings, in which:

DETAILED DESCRIPTION OF THE INVENTION

Figure 1:
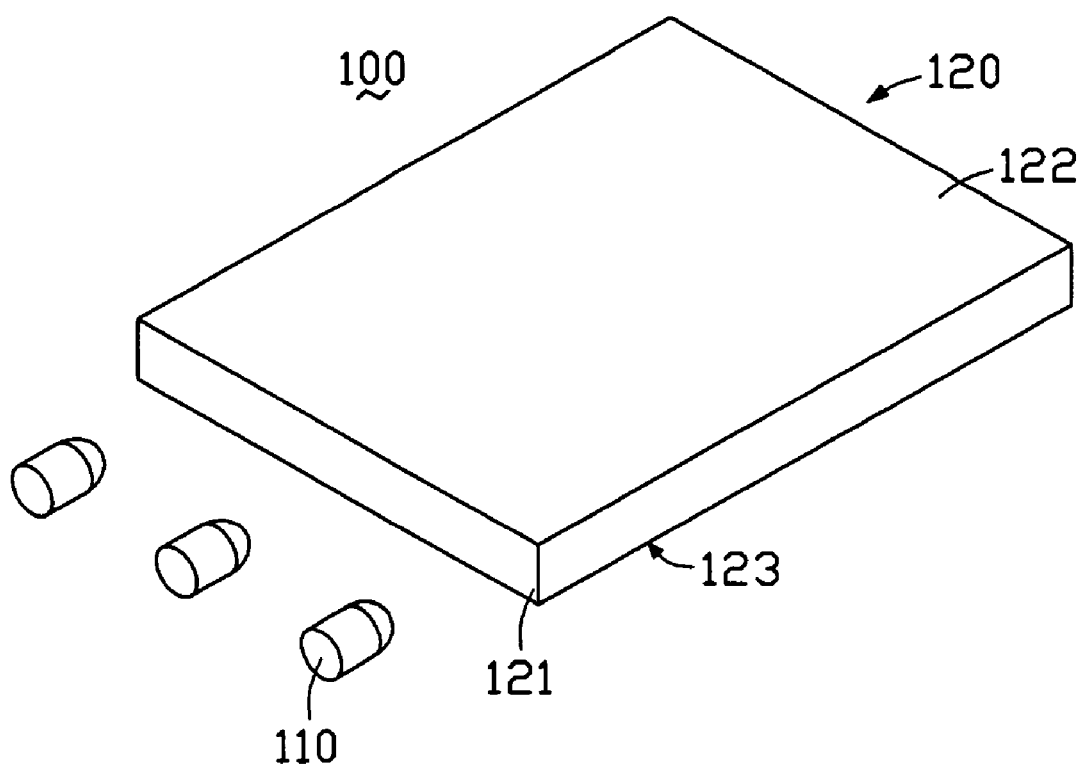
FIG. 1 is an isometric view of a planar light source device according to the present invention.

Referring to FIG. 1, a planar light source device 100 in accordance with the present invention is used to illuminate a liquid crystal display panel. The planar light source device 100 comprises a plurality of LEDs 110 and a light guide plate 120. The LEDs 110 emit light beams, and the light guide plate 120 is arranged close to the LEDs 110 to receive the light beams emitted by the light sources 110.

The light guide plate 120 is a plane rectangular slab of transparent material such as acrylic resin, polycarbonate resin, polyvinyl chloride, or glass. The light guide plate 120 comprises a light incident surface 121, a light output surface 122 adjoining the light incident surface 121, and a bottom surface 123 opposite to the light output surface 122. The light incident surface 121 and the light output surface 122 may each have an anti-reflection coating (not shown) formed thereon, to reduce reflections therefrom. The bottom surface 123 comprises a dot pattern (not shown) formed thereon, for improving uniformity of light emitted from the light output surface 122. The dot pattern can be manufactured by a screen-printing process or by an injection molding process. Sizes of the dots in the dot pattern progressively increase in a direction away from the light incident surface 121. Each dot can be hemispherical, cylindrical, frustum-shaped, cuboid, or parallelepiped. Alternatively, a plurality of v-cut grooves (not shown) can be formed in the bottom surface 123 instead of having the dot pattern. The bottom surface 123 further includes a reflective film coating (not shown) formed thereon, which prevents leakage of light beams out through the bottom surface 123 by reflecting the light beams back into the light guide plate 120.

Figure 2:
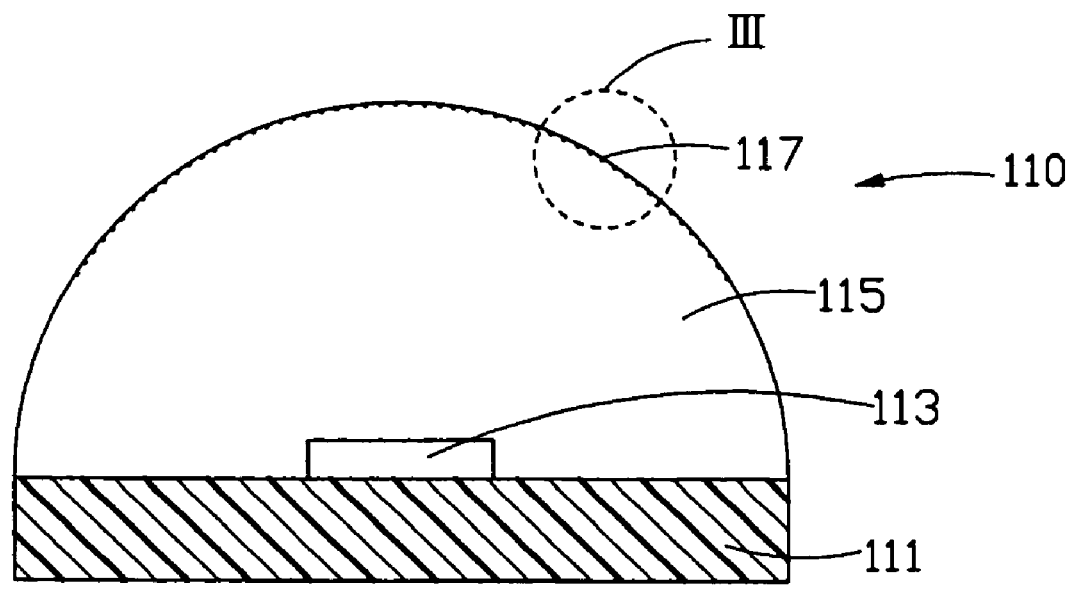
FIG. 2 is a schematic, cross-sectional view of any one LED of the planar light source device of FIG. 1.

FIG. 2 is a schematic, cross-sectional view of any one of the LEDs 110. The LED 110 comprises a mounting substrate 111, a light emitting component 113 installed on the mounting substrate 111, a coating resin 115, and a transmission-type diffraction grating 117 formed on the coating resin 115.

The light emitting component 113 is a gallium nitride compound semiconductor capable of emitting light of high luminance. The light emitting component 113 provides stable light emission over a long time of usage, as disclosed in U.S. Pat. No. 5,998,925. The light emitting component 113 can be made by forming a layer of light emitting material on a substrate. Said material is a gallium nitride semiconductor such as InGaN, and can be formed by way of a metal organic chemical vapor deposition (MOCVD) process. The light emitting component 113 may be homostructural, heterostructural or double-heterostructural, with an MIS junction (metal-insulator-semiconductor junction), a PIN junction (positive-intrinsic-negative junction) or a PN junction (positive-negative junction). Various wavelengths of emission can be selected, depending on the material of the semiconductor layer and the crystallinity thereof.

The coating resin 115 covers and protects the light emitting component 113. The coating resin 115 may be a transparent material having good weatherability, such as epoxy resin, urea resin, silicon resin or glass. The coating resin 115 functions like a lens to diffuse the light emitted by the light emitting component 113. Therefore, the coating resin 115 preferably has the configuration of a convex lens. The coating resin 115 may alternatively have other configurations, such as that of a concave lens, elliptical, or planar.

Figure 3:
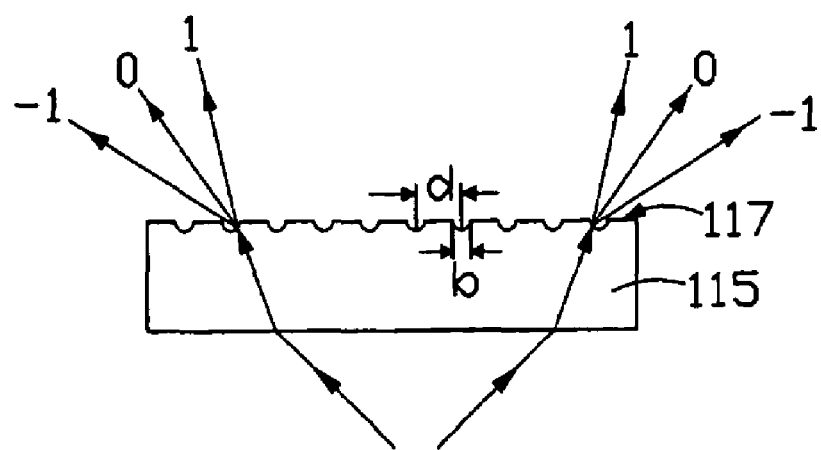
FIG. 3 is a schematic, enlarged view of a circled portion III of FIG. 2, showing exemplary light paths.

Referring to FIG. 3, the diffraction grating 117 is formed on an outer surface (not labeled) of the coating resin 115; that is, on a light emission surface of the LED 110. The diffraction grating 117 is preferably provided directly opposite to the light emitting component 113, so that most light beams emitted from the light emitting component 113 pass through the diffraction grating 117. The diffraction grating 117 comprises numerous minutely fine ruled grooves (not labeled) continuously arranged on the light emission surface. The ruled grooves are separated by a distance d, known as the grating constant. The grating constant d is preferably in the range from 10 um to 30 um, and an opening width b of each ruled groove is preferably in the range from 1 um to 10 um. The diffraction grating 117 can be formed by molding the outer surface of the coating resin 115. The diffraction grating 117 diffracts each light beam passing therethrough into different beams. Each light beam incident to the diffraction grating 117 is divided into a 0th order diffracted beam (main beam), ±1st order diffracted beams (sub-beams), ±2nd order diffracted beams (sub-beams, not shown), etc. A relationship between an incident light and corresponding diffracted light is expressed in the following equation (1):

$$(\sin i - \sin \theta) = \pm m(\lambda/d) \quad (1)$$

where i is an incident angle, $\theta$ is a diffraction angle, $\lambda$ is a wavelength of the incident light, d is the grating constant, and m is an integer. For each LED 110, the incident angle i and the wavelength $\lambda$ are fixed. Thus, in practice, the angle of diffraction $\theta$ can be controlled by configuring the grating constant d according to need.

In operation, the light emitting component 113 of each LED 110 emits light beams, and the light beams are diffracted by the diffraction grating 117 of the light emission surface of the LED 110. Each light beam is changed into a plurality of light beams propagating in different directions, which then transmit to the light incident surface 121 of the light guide plate 120.

Figure 4:
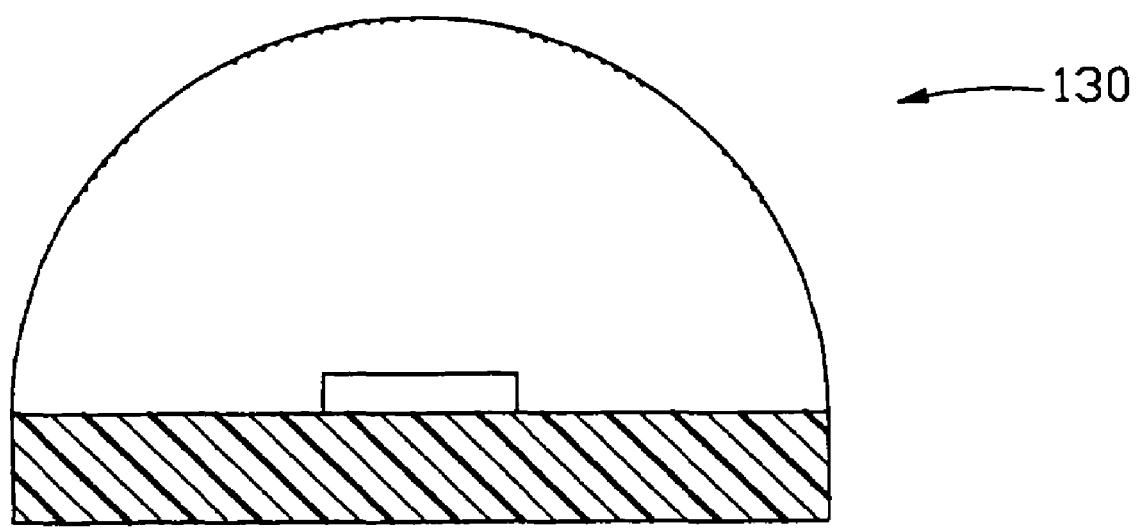
FIG. 4 is a schematic, cross-sectional view of an alternative embodiment of an LED according to the present invention.
Figure 5:
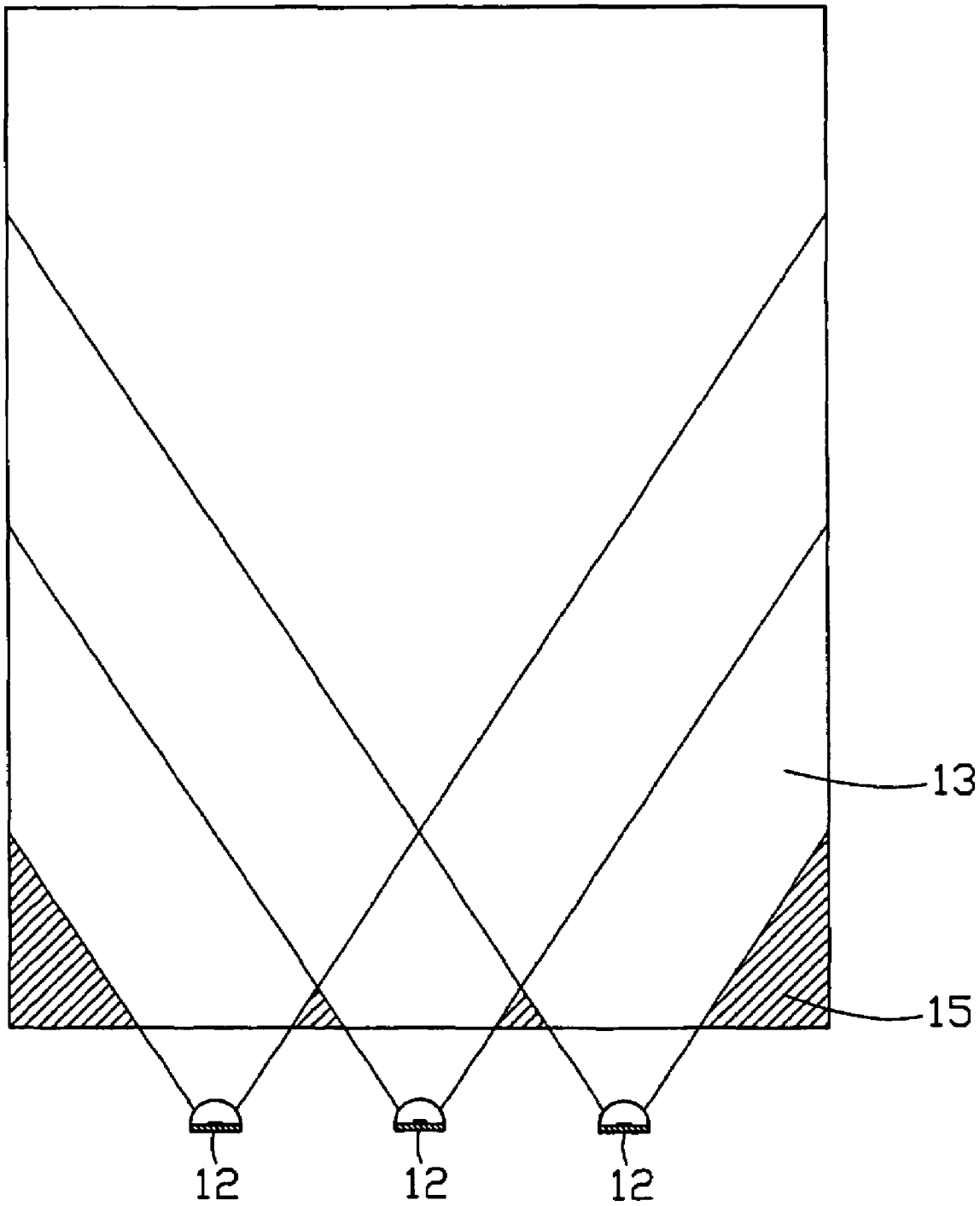
FIG. 5 is a schematic, cross-sectional view of a conventional planar light source device having a plurality of LEDs as light sources.

FIG. 4 shows an alternative embodiment of the LED 110. The ruled grooves of the diffraction grating 117 are discontinuously arranged on the light emission surface of the LED 110. Further, the ruled grooves of the diffraction grating 117 can alternatively be replaced by a plurality of ruled lines, or a plurality of ruled slits. In still further alternative embodiments, the light guide plate 120 can be wedge-shaped or have a triangular profile.

In summary, the planar light source device 100 of the present invention employs the LEDs 110 having the diffraction gratings 117 in order to provide a broader range of light beams entering the light guide plate 120. Each light beam emitted from each LED 110 and transmitting through the diffraction grating 117 is diffracted into a plurality of light beams propagating in different directions. Accordingly, the diffracted light beams enter the light incident surface 121 of the light guide plate 120 over a larger range of regions in comparison with prior art planar light source devices. As a result, dark areas in the light guide plate 120 can be diminished or eliminated altogether, and the planar light source device 100 can provide uniform illumination. In addition, divergence angles of the LEDs 110 can be controlled by adjusting the grating constant d of the diffraction grating 117.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A light emitting diode, comprising:
a mounting substrate;
a light emitting component installed on the mounting substrate;
a coating resin covering the light emitting component and having a light emission surface; and
a diffraction grating positioned at the light emission surface;
wherein light beams emitted from the light emitting component are diffracted by the diffraction grating in order to propagate in different directions our from the light emission surface of the coating resin, the light emission surface is a convex-shaped surface configured for diffusing the light beams emitted from the light emitting component, and the light emission surface equidistantly surrounds the light emitting component.

2. The light emitting diode as described in claim 1, wherein the diffraction grating is a transmission-type diffraction grating.

3. The light emitting diode as described in claim 1, wherein the diffraction grating comprises fine ruled grooves, lines or slits on the light emission surface.

4. The light emitting diode as described in claim 1, wherein the diffraction grating is provided continuously on the light emission surface.

5. The light emitting diode as described in claim 1, wherein the diffraction grating is provided discontinuously on the light emission surface.

6. The light emitting diode as described in claim 4, wherein the diffraction grating is provided on the light emission surface over a selected light output range of the light emitting component.

7. The light emitting diode as described in claim 5, wherein the diffraction grating is provided on the tight emission surface over a selected light output range of the light emitting component.

8. A planar light source device for a display device comprising:
- a light guiding plate having a light incident surface; and
- at least one light emitting diode located in the vicinity of the light incident surface, each light emitting diode comprising:
  - a mounting sub state;
  - a light emitting component installed on the mounting substrate;
  - a coating resin covering the light emitting component and having a light emission surface; and
  - a diffraction grating positioned at the light emission surface;
- wherein light beans emitted from the light emitting component are diffracted by the diffraction grating in order to propagate in different directions out from the light emission surface of the coating resin, the light emission surface is an convex-shaped surface configured for diffusing the light beams emitted from the light emitting component, and the light emission surface equidistantly surrounds the light emitting component.

9. The planar light source device as described in claim 8, wherein the diffraction grating is a transmission-type diffraction grating.

10. The planar light source device as described in claim 8, wherein the diffraction grating comprises fine ruled grooves, lines or slits on the light emission surface.

11. The planar light source device as described in claim 8, wherein the diffraction grating is provided continuously on the light emission surface.

12. The planar light source device as described in claim 8, wherein the diffraction grating is provided discontinuously on the light emission surface.

13. The planar light source device as described in claim 11, wherein the diffraction grating is provided on the light emission surface over a selected light output range of a light emitting component of said light emitting diode.

14. The planar light source device as described in claim 12, wherein the diffraction grating is provided on the light emission surface over a selected light output range of a light emitting component of said light emitting diode.

15. A light emitting diode, comprising:
- a mounting substrate;
- a light emitting component installed on the mounting substrate;
- a light emission surface located above said substrate and equidistantly surrounding said light emitting component; and
- a diffraction grating positioned at the light emission surface;
- wherein light beams emitted from the light emitting component are diffracted by the diffraction grating in order to propagate in different directions out from the light emission surface, and the light emission surface is an convex-shaped surface configured for diffusing the light beams emitted from the light emitting component.

* * * * *